United States Patent [19]
Okabe

[11] Patent Number: 5,861,659
[45] Date of Patent: Jan. 19, 1999

[54] SEMICONDUCTOR DEVICE

[75] Inventor: Takahiko Okabe, Isehara, Japan

[73] Assignee: Canon Kabushiki Kaisha, Tokyo, Japan

[21] Appl. No.: 328,342

[22] Filed: Oct. 21, 1994

Related U.S. Application Data

[63] Continuation of Ser. No. 10,473, Jan. 28, 1993, abandoned, which is a continuation of Ser. No. 757,995, Sep. 12, 1991, abandoned.

[30] Foreign Application Priority Data

Sep. 17, 1990 [JP] Japan ................................. 2-246542
Aug. 27, 1991 [JP] Japan ................................. 3-240350

[51] Int. Cl.$^6$ ..................... H01L 29/41; H01L 29/732
[52] U.S. Cl. ..................... 257/518; 257/554; 257/592
[58] Field of Search ..................... 357/34; 257/518, 257/588, 511, 554, 555, 592, 630, 652

[56] References Cited

U.S. PATENT DOCUMENTS

| | | | |
|---|---|---|---|
| 3,483,446 | 12/1969 | Van Der Leest | 257/592 |
| 3,959,810 | 5/1976 | Takeda | 257/652 |
| 4,252,582 | 2/1981 | Anantha et al. | 257/588 |
| 4,752,591 | 6/1988 | Beitman | 257/580 |
| 4,984,053 | 1/1991 | Kayanuma | 257/518 |
| 5,059,549 | 10/1991 | Fukuhata | 437/59 |
| 5,294,558 | 3/1994 | Subbanna | 257/518 |
| 5,525,833 | 6/1996 | Jang | 257/588 |
| 5,528,066 | 6/1996 | Hunt | 257/588 |

FOREIGN PATENT DOCUMENTS

| | | |
|---|---|---|
| 0189136 | 7/1986 | European Pat. Off. . |
| 0301468 | 2/1989 | European Pat. Off. ................. 357/34 |
| 0327859 | 8/1989 | European Pat. Off. . |
| 0375323 | 6/1990 | European Pat. Off. ................. 357/34 |
| 189168 | 7/1989 | Japan ...................................... 357/34 |
| WOA8203496 | 3/1982 | WIPO . |

OTHER PUBLICATIONS

Patent Abstracts of Japan, vol. 8, No. 200 (E–266) (1637), Sep. 13, 1984; & JP–A–59 087861 (Toshiba) May 21, 1984.
Patent Abstracts of Japan, vol. 13, No. 8, (E–702) (3356), Jan. 10, 1989; & JP–A–63 219166 (Sanyo Electric) Sep. 12, 1988.
*IBM Technical Disclosure Bulletin*, vol. 31, No. 12, May 31, 1989, pp. 353–354.
J. Warnock et al., "Boron–Doped Emitters For High–Performance Vertical PNP Transistors," *Proceedings of the 1989 Bipolar Circuits and Technology Meeting*, Sep. 1989, pp. 186–189.
*Patent Abstracts of Japan*, vol. 11, No. 122, Apr. 16, 1987 & JP–A–61268065 (Matsushita) Nov. 27, 1986.
G. P. Li, et al., "Identification and Implication of a Perimeter Tunneling Current Component in Advanced Self–Aligned Bipolar Transistors," IEEE Transactions on Electron Devices, vol. ED–35, No. 1, Jan. 1988, pp. 89–95.

*Primary Examiner*—Jerome Jackson, Jr.
*Assistant Examiner*—David B. Hardy
*Attorney, Agent, or Firm*—Fitzpatrick, Cella, Harper & Scinto

[57] ABSTRACT

In a semiconductor device having regions of a vertical pnp bipolar transistor, that is, a collector region composed of a p-type semiconductor region, a base region composed of an n-type semiconductor region and an emitter region composed of a p-type semiconductor region, a metal electrode is connected to the base region with polysilicon doped with impurities being provided therebetween. In another form of a semiconductor device, an $n^+$ region is provided within a base region of a vertical pnp bipolar transistor while surrounding an emitter region of the transistor.

10 Claims, 9 Drawing Sheets

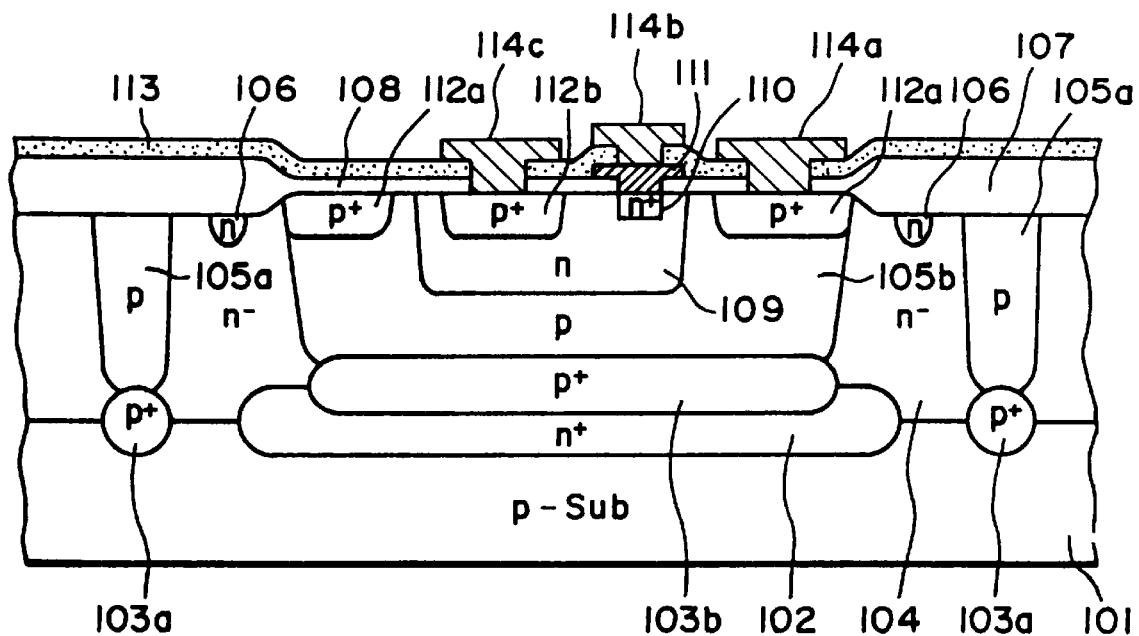
F I G. 2

SEMICONDUCTOR DEVICE

This application is a continuation, of application Ser. No. 08/010,473 filed Jan. 28, 1993, now abandoned, which is a continuation of application Ser. No. 07/757,995 filed Sep. 12, 1991, now abandoned.

BACKGROUND OF THE INVENTION

1. Field of the Invention

The present invention relates to a semiconductor device and, more particularly, to a semiconductor device having a structure that allows a reduction in the cell size of a vertical bipolar transistor.

2. Related Background Art

FIG. 1 schematically shows an example of the construction of a vertical pnp bipolar transistor.

Referring to FIG. 1, the transistor includes a p-type semiconductor substrate 101, an $n^+$-type buried layer 102, $p^+$-type buried layers 103a and 103b, an n-type epitaxial layer 104, a p-type isolation region 105a, a p-type collector region 105b, an n-type channel-cut region (channel stopper) 106, a field oxide 107, gate oxide film 108, an n-type base region 109, an $n^+$-type base diffusion region 110, a $p^+$-type collector electrode 112a, a $p^+$-type emitter region 112b, an inter-layer CVD film 113, a collector metal electrode 114a, a base metal electrode 114b, and an emitter metal electrode 114c.

As shown in FIG. 1, the vertical pnp bipolar transistor has the $n^+$-type buried layer 102, the $p^+$-type buried layer 103b and the p-type collector region 105b, all being subsequently formed on the p-type semiconductor substrate 101 of single-crystal silicon or the like. Also, the n-type epitaxial layer 104 is formed surrounding the p-type collector region 105b. Within the p-type collector region 105b, the $p^+$-type emitter region 112b and the $n^+$-type base diffusion region 110 are formed. The $p^+$-type collector electrode 112a is provided contacting the p-type collector region 105b. On the $p^+$-type collector electrode 112a, the $p^+$-type emitter region 112b, and the $n^+$-type base diffusion region 110, the collector metal electrode 114a, the emitter metal electrode 114c, and the base metal electrode 114b are respectively provided.

Hitherto, the base metal electrode 114b has been provided on the $n^+$-type base diffusion region 110 through a contact (not shown) after the formation of the region 110 by implanting ions into the n-type base region 109.

However, in a vertical bipolar transistor having the above-described construction, the margin around the base metal electrode 114b, that is, the respective distances from the $n^+$-type base diffusion region 110 to the $p^+$-type emitter region 112b and to the $p^+$-type collector electrode 112a, is inevitably determined by such factors as the level of precision with which the regions, etc. are aligned with each other during the processes in which they are formed. Thus, a problem arises, and it is difficult to reduce the cell size of a vertical pnp bipolar transistor.

Also, inversion at the surface of the n-type base region 109 may sometimes entail a reliability problem.

SUMMARY OF THE INVENTION

An object of the present invention is to overcome the above problems, and to provide a vertical pnp bipolar transistor which has a small cell size, and which is provided with measures against inversion at the base surface.

BRIEF DESCRIPTION OF THE DRAWINGS

FIG. 2, and FIGS. 4 through 8 are sectional views each schematically illustrating further embodiments of the construction of a vertical pnp bipolar transistor according to the present invention.

FIG. 4 shows the construction of a vertical pnp bipolar transistor produced in this embodiment.

FIG. 5 shows the construction of a vertical pnp bipolar transistor produced in a further embodiment.

FIG. 6 shows the construction of a vertical pnp bipolar transistor produced in a still further embodiment.

FIG. 7 shows the construction of a vertical pnp bipolar transistor produced in a still further embodiment.

FIG. 8 shows the construction of a vertical pnp bipolar transistor produced in a still further embodiment.

DETAILED DESCRIPTION OF THE PREFERRED EMBODIMENTS

According to certain embodiments of the present invention, the above-stated object is achieved by a semiconductor device in which a metal electrode is connected to a base region of a vertical pnp bipolar transistor with polysilicon doped with impurities being provided therebetween (as a result of using a doped polysilicon (DOPOS) method).

More specifically, if a base electrode is formed by a DOPOS method employing doped polysilicon, that is, by employing impurity-containing polysilicon as the source of diffusion, so that the base electrode is formed in a self-aligning manner, it is possible to reduce the size of the base electrode in accordance with the size of the opening formed in the gate oxide film. Simultaneously if an emitter region is formed in a self-aligning manner by utilizing the polysilicon provided during the formation of the base electrode by the DOPOS method, it is possible to reduce the distance between the base and the emitter. An $n^+$ region resulting from the above formation preferably has an impurity concentration of $10^{19}$ to $10^{20}$ cm$^{-3}$, and a depth of 0.1 to 0.5 $\mu$m.

If an $n^+$ guard ring surrounding an emitter is provided on the surface of an n-type base region, or if a field plate of either a metal such as aluminum or base polysilicon is provided corresponding to the surface of the base region, it is possible to prevent inversion of the base surface. In this way, therefore, it is possible to provide a semiconductor device the reliability of which is improved, and which is prevented from having its withstand voltage deteriorated between the collector and the emitter. The $n^+$ guard ring preferably has an impurity concentration of at least about $10^{17}$ cm$^{-3}$ ($10^{17}$ to $10^{20}$ cm$^{-3}$).

FIG. 2 is a sectional view schematically illustrating an example of the construction of a vertical pnp bipolar transistor according to an embodiment of the present invention.

Figure 1:
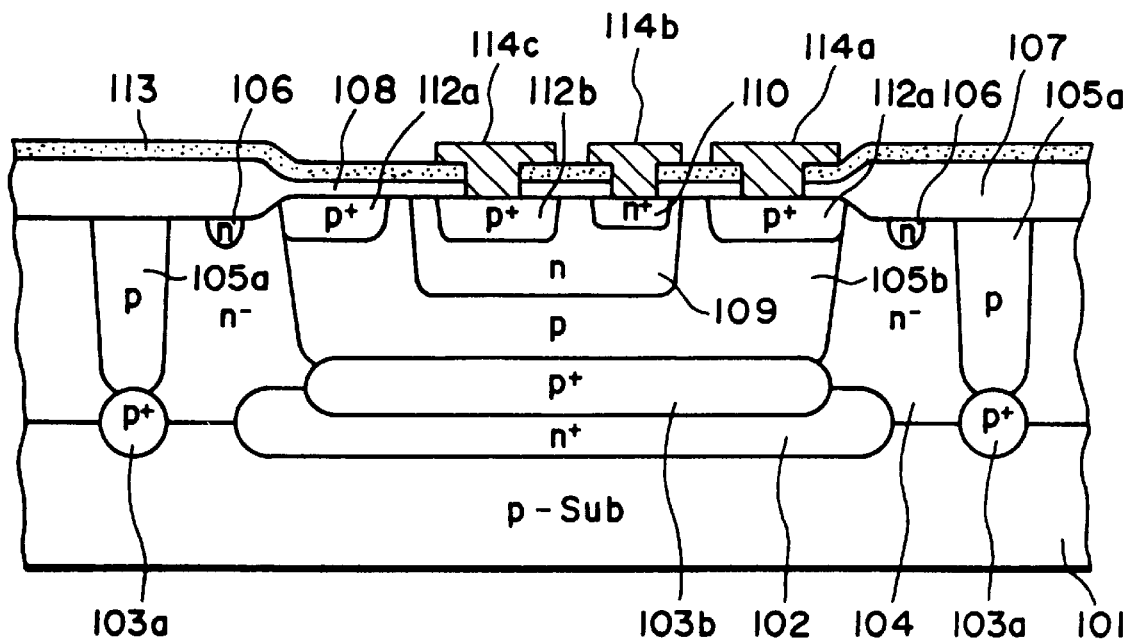
FIG. 1 is a sectional view schematically illustrating an example of the construction of a vertical pnp bipolar transistor.

In FIG. 2, components which are the same as those in FIG. 1 are denoted by identical reference numerals, and a detailed description of these components will be omitted.

As shown in FIG. 2, the vertical pnp bipolar transistor has a p-type silicon substrate 101 and a double buried-layer structure on the substrate 101, the structure consisting of an n-type buried layer 102 and $p^+$-type buried layers 103a and 103b with the layer 103b superimposed on the first buried layer 102. The transistor further has an $n^+$-type base electrode 110 formed by a DOPOS method.

Denoted by reference numeral 111 in the figure is n-type polysilicon serving as the DOPOS and constituting one of the main characteristics of the present invention. The transistor further includes a p-type collector region 105b, an n-type base region 109, a p⁺-type emitter region 112b, a collector metal electrode 114a, a base metal electrode 114b, and an emitter metal electrode 114c.

Referring to FIGS. 3A through 3G, an example of a preferred method of producing a semiconductor device according to the present invention will be described in detail. Although the above description will be given referring to FIGS. 3A to 3G and concerning an example of a method used to produce a semiconductor device of exactly the same type as that shown in FIG. 2, reference numerals used in FIGS. 3A to 3G do not correspond to those used in FIG. 2.

Figure 3A:
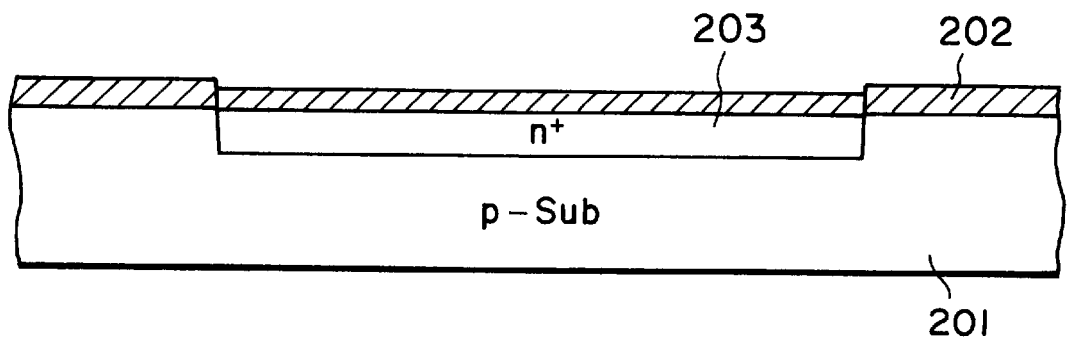
FIGS. 3A through 3G are sectional views schematically illustrating an example of a process for producing a vertical pnp bipolar transistor according to the present invention.

First, a thermal oxidation film was formed, as an insulation film to serve as a diffusion mask, on the surface of a p-type silicon substrate 201 having a resistivity of 10 to 20 Ω·cm, and then the thermal oxidation film was patterned, thereby forming a thermal oxidation film 202 having an opening at a position above a certain portion where an n⁺-type buried layer was to be formed. Subsequently, while the thermal oxidation film 202 was used as the mask, n-type impurities were thermally diffused in a selective manner, thereby forming an n⁺-type buried layer 203. (FIG. 3A).

Figure 3B:
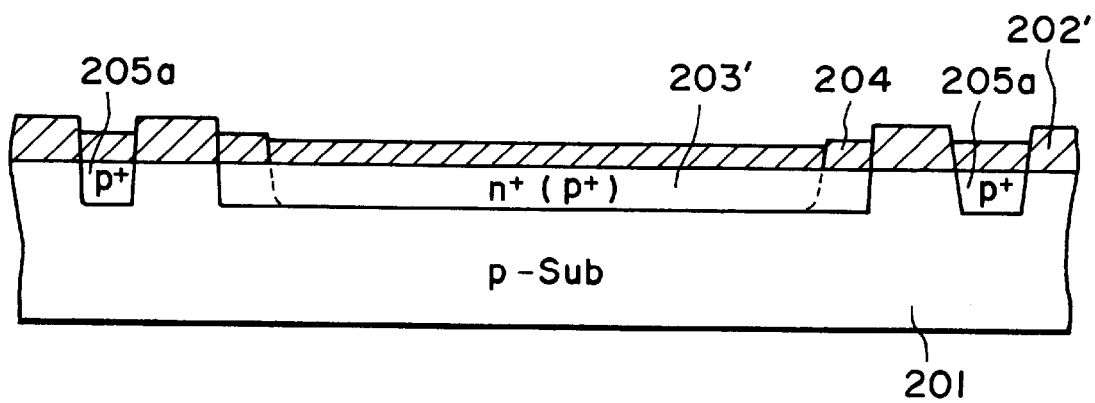

Thereafter, the thermal oxidation film 202 was again patterned so that the film 202 was formed into a thermal oxidation film 202' having an opening at a position above a certain portion where a p⁺-type buried layer was to be formed. Also, only that part of another thermal oxidation layer 204 covering the n⁺-type buried layer 203' was selectively removed. Subsequently, while the two thermal oxidation films 204 and 202' served as masks, P-type impurities were selectively diffused, thereby forming a p⁺-type buried layer 205a, and doping the n⁺-type buried layer 203' with p-type impurities as well (FIG. 3B).

The p⁺-type buried layer 205a was formed in such a manner that it completely surrounded the n⁺-type buried layer 203'.

Subsequently, the whole of the thermal oxidation films 204 and 202' remaining on the silicon substrate 201 were removed, and then an n-type epitaxial layer 206 was formed.

Figure 3C:
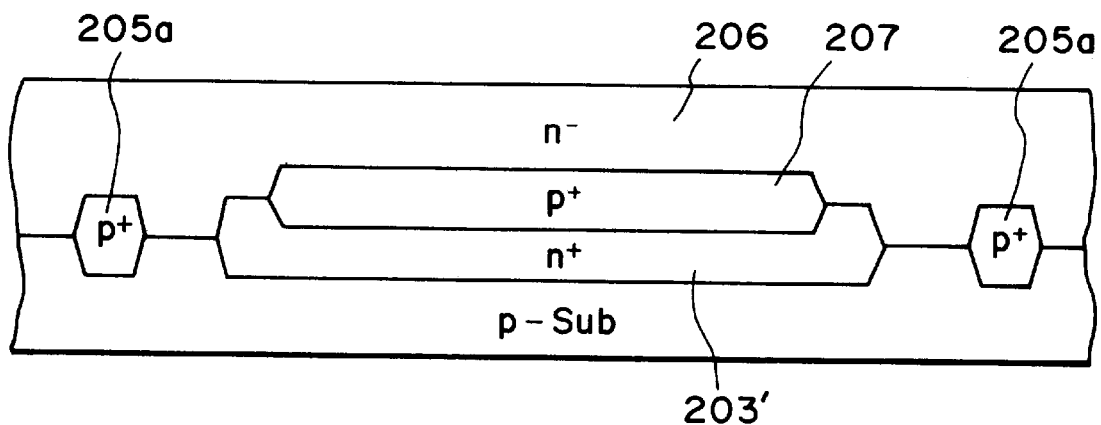

During the epitaxial growth, impurities were diffused from the high-concentration buried layers 203' and 205a to the n-type epitaxial silicon layer 206. In particular, from the n⁺-type buried layer 203', not only n-type impurities but also p-type impurities (with which the layer 203' was doped during the second doping) were diffused, thereby forming a p⁺-type buried layer 207 on the n⁺-type buried layer 203' (FIG. 3C).

Thereafter, boron ions were implanted through a thin oxide film from the surface of the n-type epitaxial layer 206 into only desired portions of the layer 206 by employing a resist mask or an oxide mask, thereby forming a p-type isolation region 208a and a p-type collector region 208b.

Figure 3D:
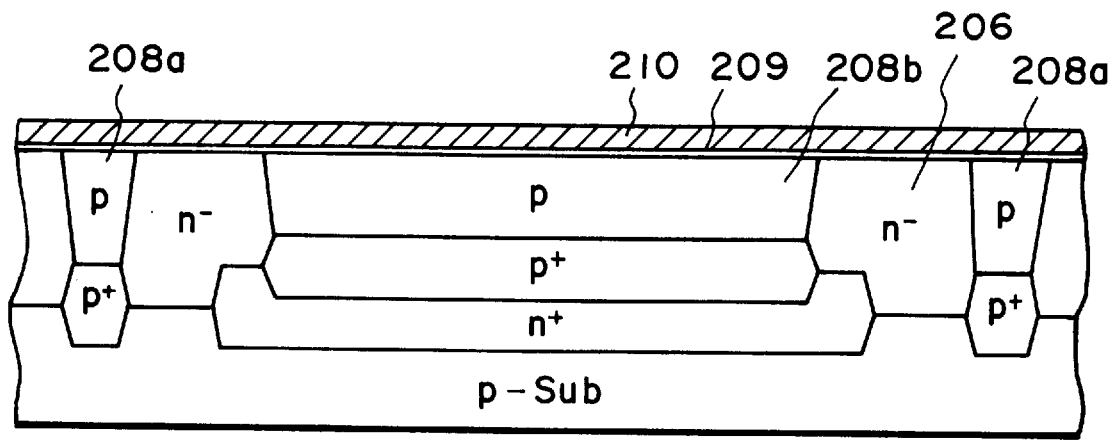

Subsequently, a thermal oxidation film 209 was formed on the surfaces of the n-type epitaxial layer 206, the p-type isolation region 208a and the p-type collector region 208b and, further on the film 209, a CVD silicon nitride film is formed as a non-oxidation film 210 (FIG. 3D).

The thermal oxidation film 209 and the non-oxidation film 210 were patterned, and subjected to selective oxidation, thereby forming an element region and the other field region. Before the selective oxidation, an n-type channel-cut region 211a for preventing inversion were formed by ion implantation at a position of the portion to be formed into the field region.

Figure 3E:
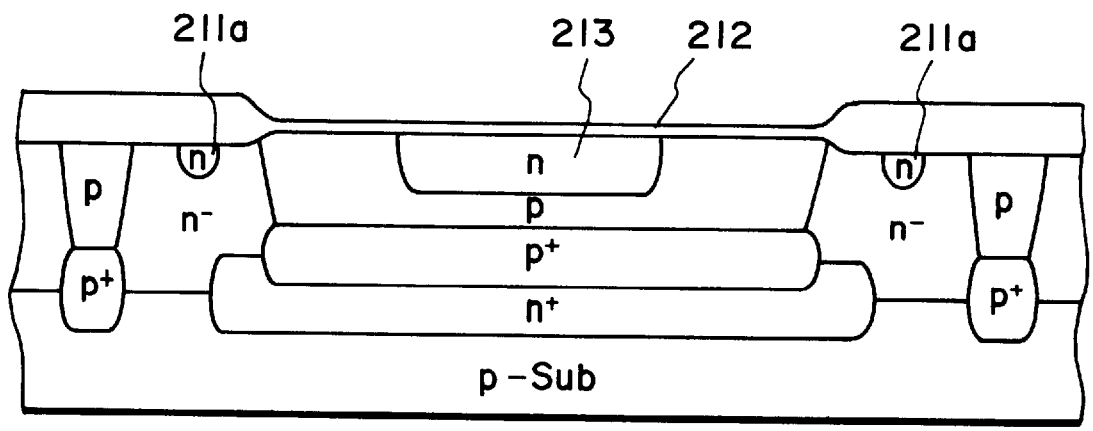

In the element region that is, a region in which the element is formed, or a region corresponding to one in which the element is formed, the thermal oxidation film 209 and the non-oxidation insulation film 210 were subjected to selective oxidation to remove certain parts thereof, thereby forming a gate oxide film 212. Subsequently, after resist patterning, phosphorus (P) ions were implanted at 1×10¹³ cm⁻² and at an acceleration voltage of 160 KeV, thereby forming an n-type base region 213 (FIG. 3E).

Thereafter, an electrode in the n-type base region was formed by a DOPOS method. An opening 214 was formed at a base electrode portion of the gate oxide film 212, a polysilicon layer 215 was deposited over and through the opening 214, P was diffused in the polysilicon layer 215, and heat treatment was performed, thereby forming an n⁺-type base electrode 216. The polysilicon was patterned so that it existed only at the electrode portion.

Figure 3F:
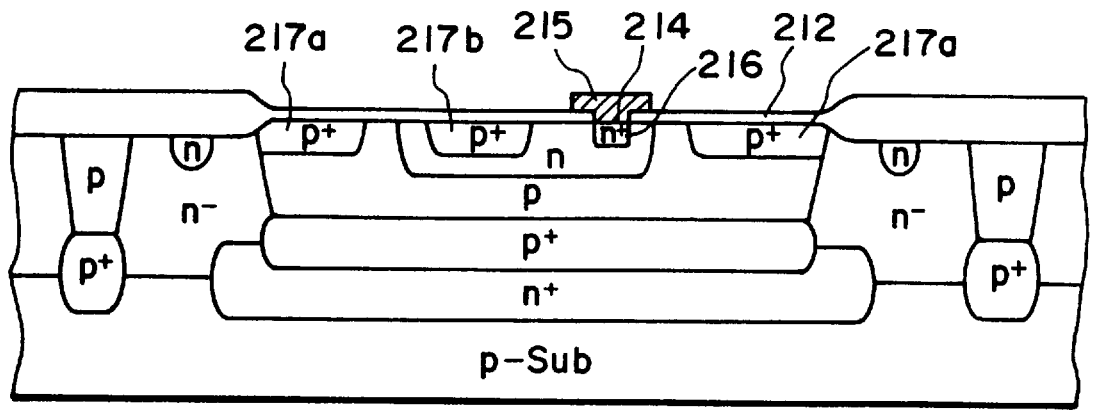

Subsequently, a p⁺ emitter region 217b and a p⁺collector electrode 217a were formed by, after resist patterning, implanting boron ions (FIG. 3F).

Figure 3G:
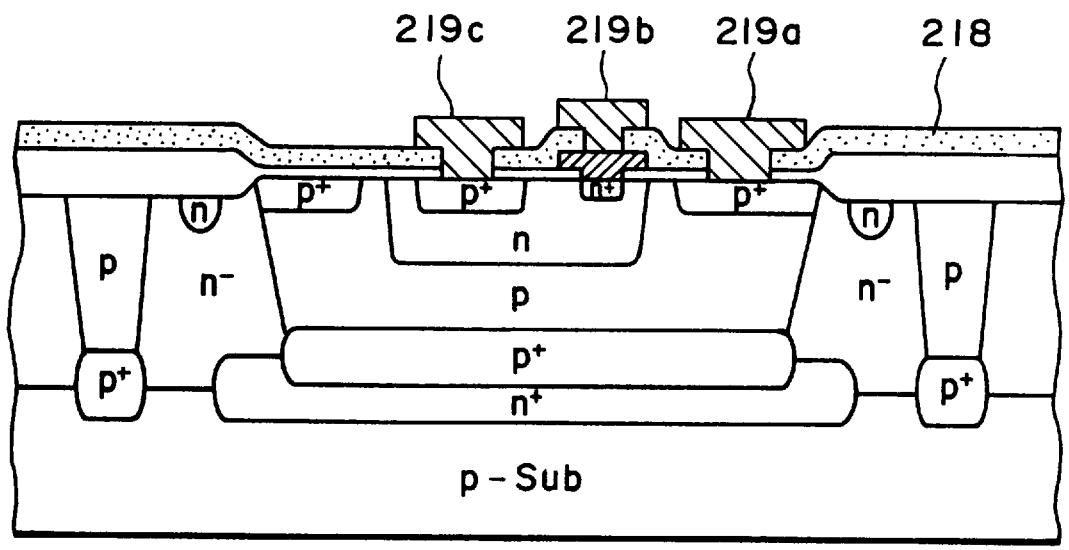

Finally, an inter-layer CVD film 218 was deposited, contacts were formed at the electrode portions by patterning, and wiring metal films was deposited on the contacts and patterned, thereby forming a collector metal electrode 219a, a base metal electrode 219b, and an emitter metal electrode 219c, thereby completing a vertical pnp bipolar transistor, as shown in FIG. 3G.

The vertical pnp bipolar transistor thus completed had a smaller cell size than a conventional vertical bipolar transistor by virtue of the method by which the transistor was produced, the method being advantageous in that, when compared with a method where a base electrode is formed directly from a wiring metal film, there is no need to include a base contact margin from the n⁺-type base diffusion layer at the base electrode portion.

Other embodiments of the present invention will be described.

Embodiment 2

Figure 4:
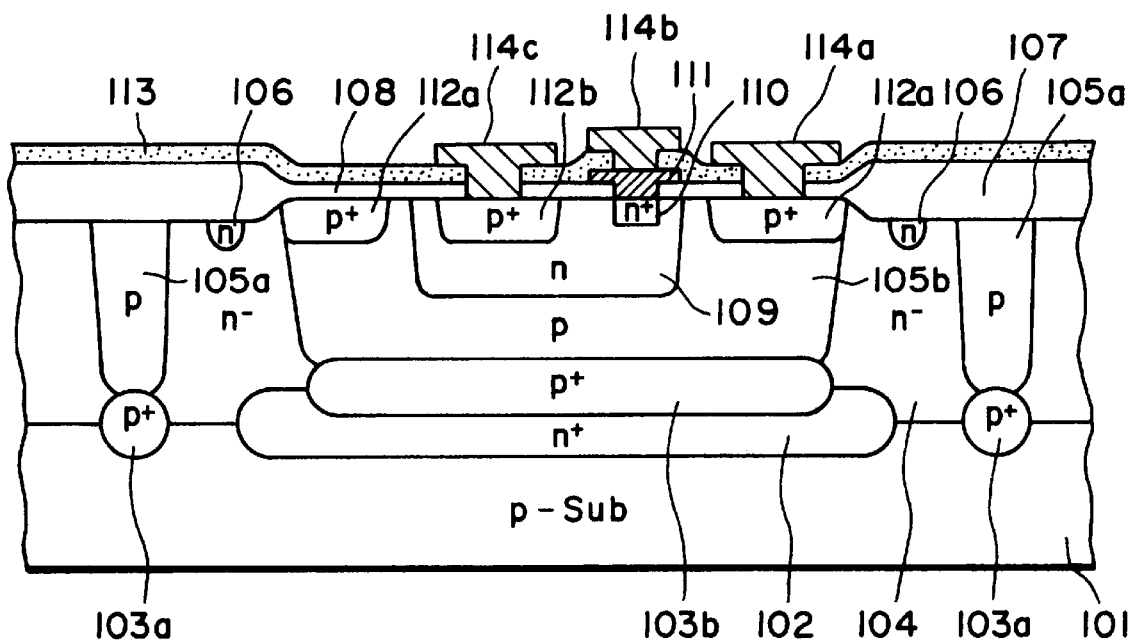

FIG. 4 shows the construction of a vertical pnp bipolar transistor produced in this embodiment. In this embodiment, in the production of the transistor, an p⁺-type emitter region 112b was formed by ion implantation in a self-aligning manner while n-type polysilicon 111 was used as the mask, so that the base electrode side of the p⁺-type emitter region 112b was thus determined. Except for the above formation of the p⁺-type emitter region 112b, the production process employed in this embodiment was exactly the same as that in the previous embodiment.

In the vertical pnp bipolar transistor according to this embodiment, a reduction in the distance between the n⁺-type base electrode 110 and the p⁺-type emitter region 112b has been achieved, rendering the distance shorter than that in a conventional device.

Embodiment 3

Figure 5:
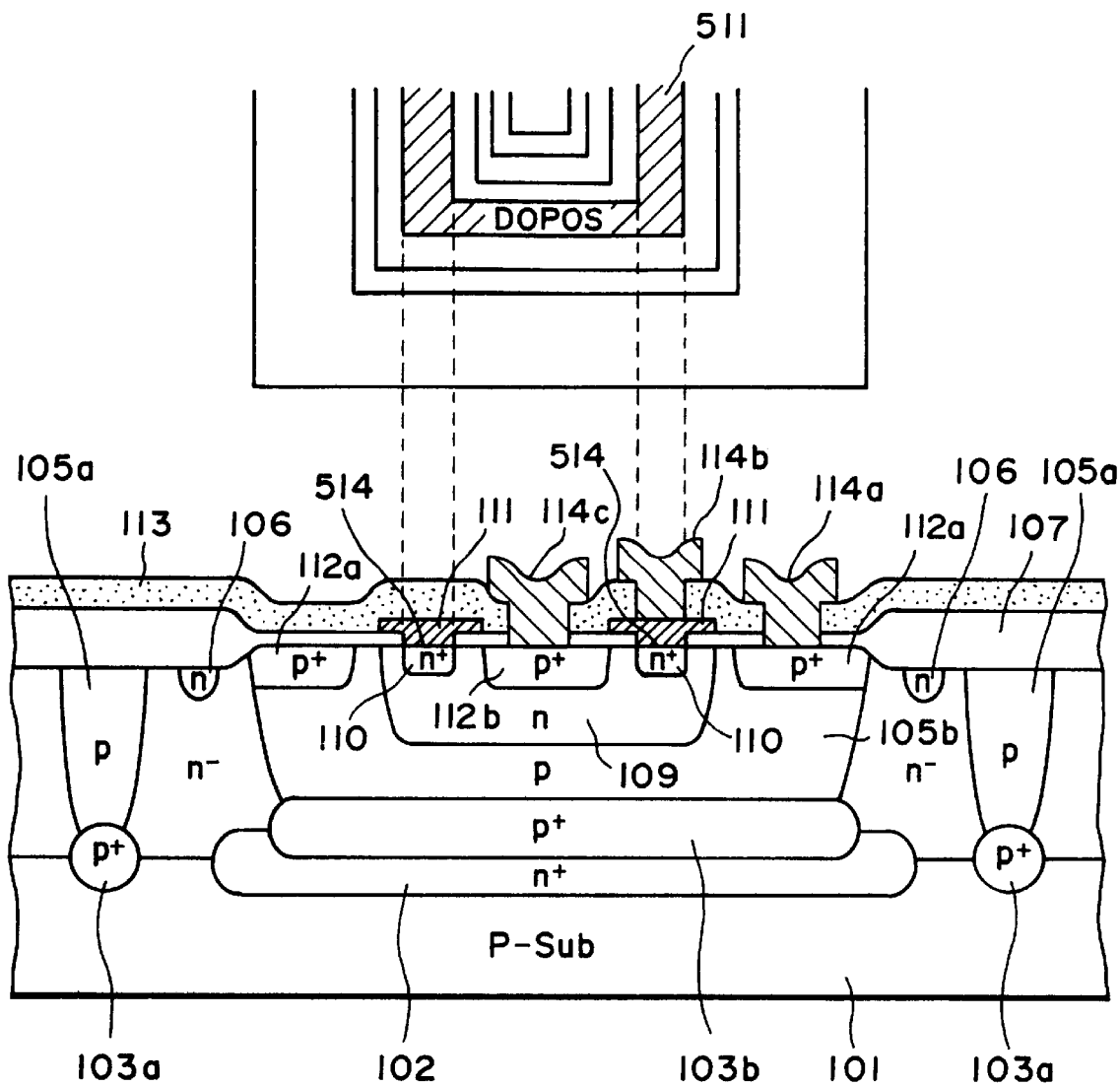

FIG. 5 shows the construction of a vertical pnp bipolar transistor produced in a further embodiment. In this embodiment, the same production process as that in the first embodiment was employed except that a patterning was performed to form an opening 514, which would surround the emitter, in a gate oxide film on the surface of an n-type base region 109, and that a polysilicon layer was deposited over and through the opening 514.

In the vertical pnp bipolar transistor according to this embodiment, a guard ring of n-type DOPOS exists on the surface of the n-type base region, thereby restraining the withstand voltage between the collector and the emitter from being deteriorated.

Embodiment 4

Figure 6:
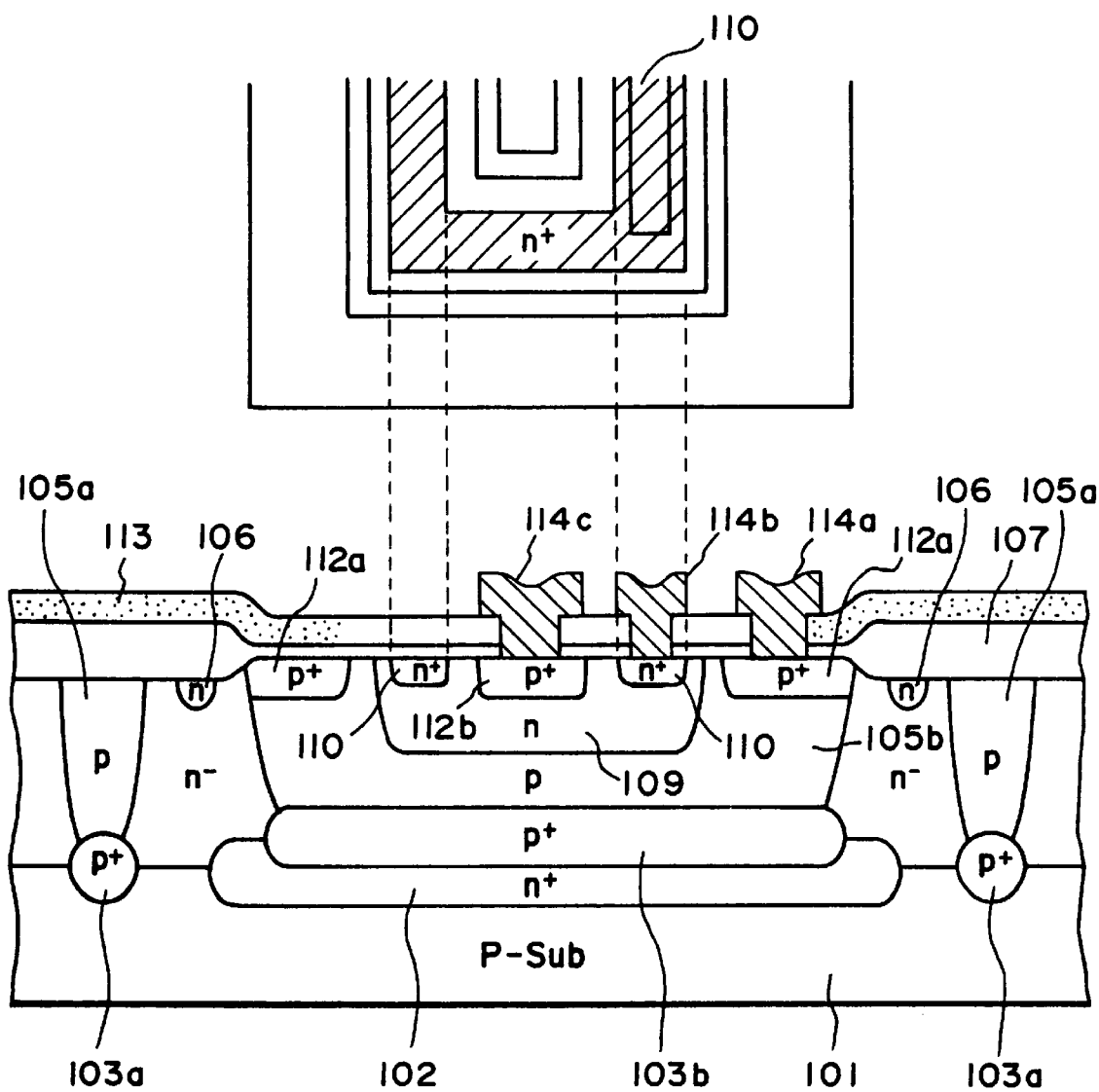

FIG. 6 shows the construction of a vertical pnp bipolar transistor produced in a still further embodiment. In this embodiment, in the production of the transistor, a resist patterning was performed to allow ions to be injected through a gate oxide film on an n-type base region 109, to thereby obtain an n$^+$-type diffusion layer which would surround the emitter. Thus, a base electrode was formed in this embodiment by a method different from the DOPOS method employed in the first embodiment. Except for the above formation, the production process employed in this embodiment was the same as that in the first embodiment.

In the vertical pnp bipolar transistor according to this embodiment, a guard ring of an n$^+$-type diffusion layer exists on the surface of the n-type base region, thereby restraining the withstand voltage between the collector and the emitter from being deteriorated.

Embodiment 5

Figure 7:
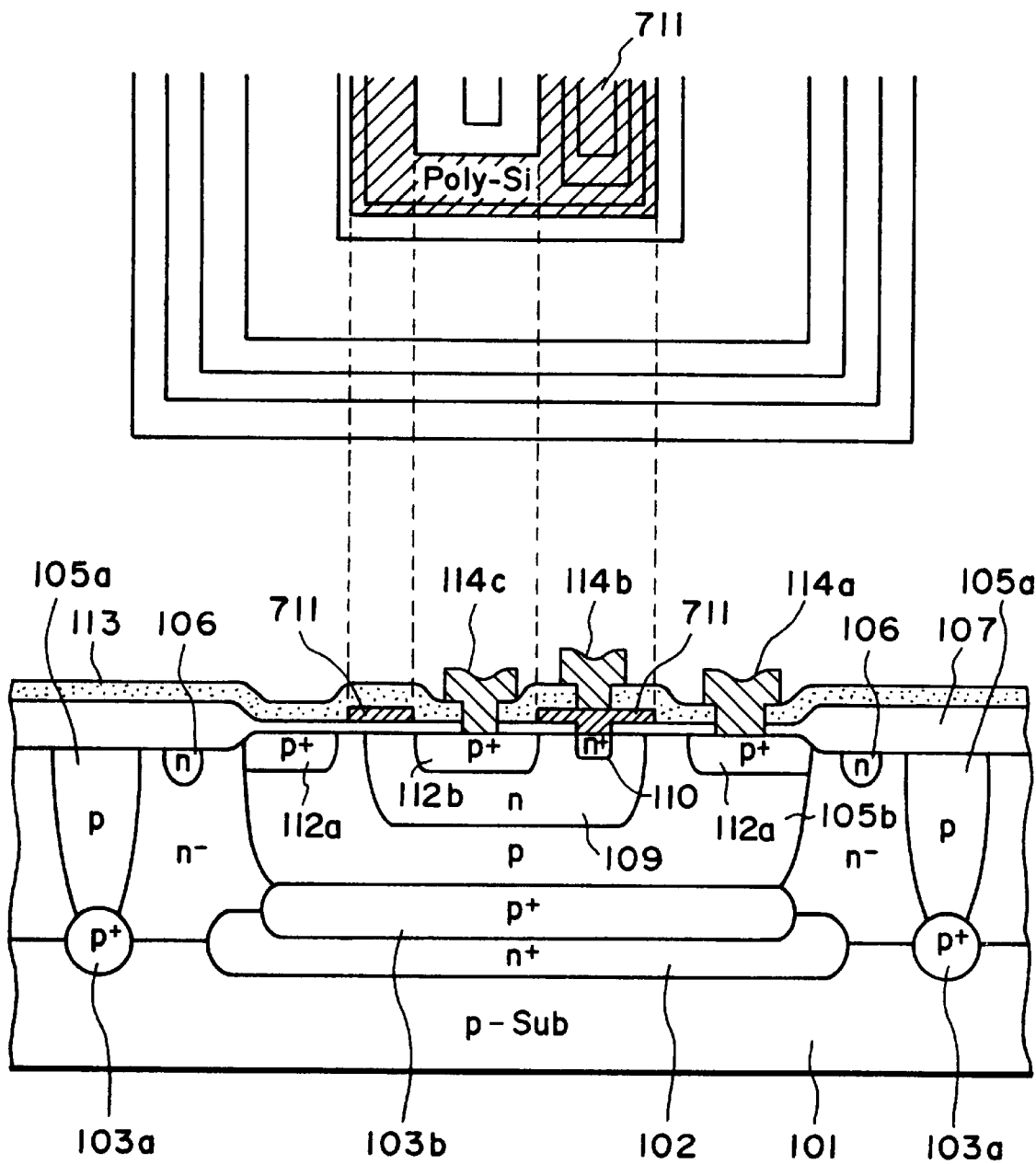

FIG. 7 shows the construction of a vertical pnp bipolar transistor produced in a still further embodiment. In this embodiment, in the production of the transistor, polysilicon 711, to be used as a part of the base electrode, was provided in such a manner as to surround the emitter, thereby providing a field plate on the surface of an n-type base region 109. Except for the above provision, the production process employed in this embodiment was the same as that in the first embodiment.

With the vertical pnp bipolar transistor according to this embodiment, it is possible to fix the surface potential of the n-type base region, and to restrain the withstand voltage between the collector and the emitter from being deteriorated.

Embodiment 6

Figure 8:
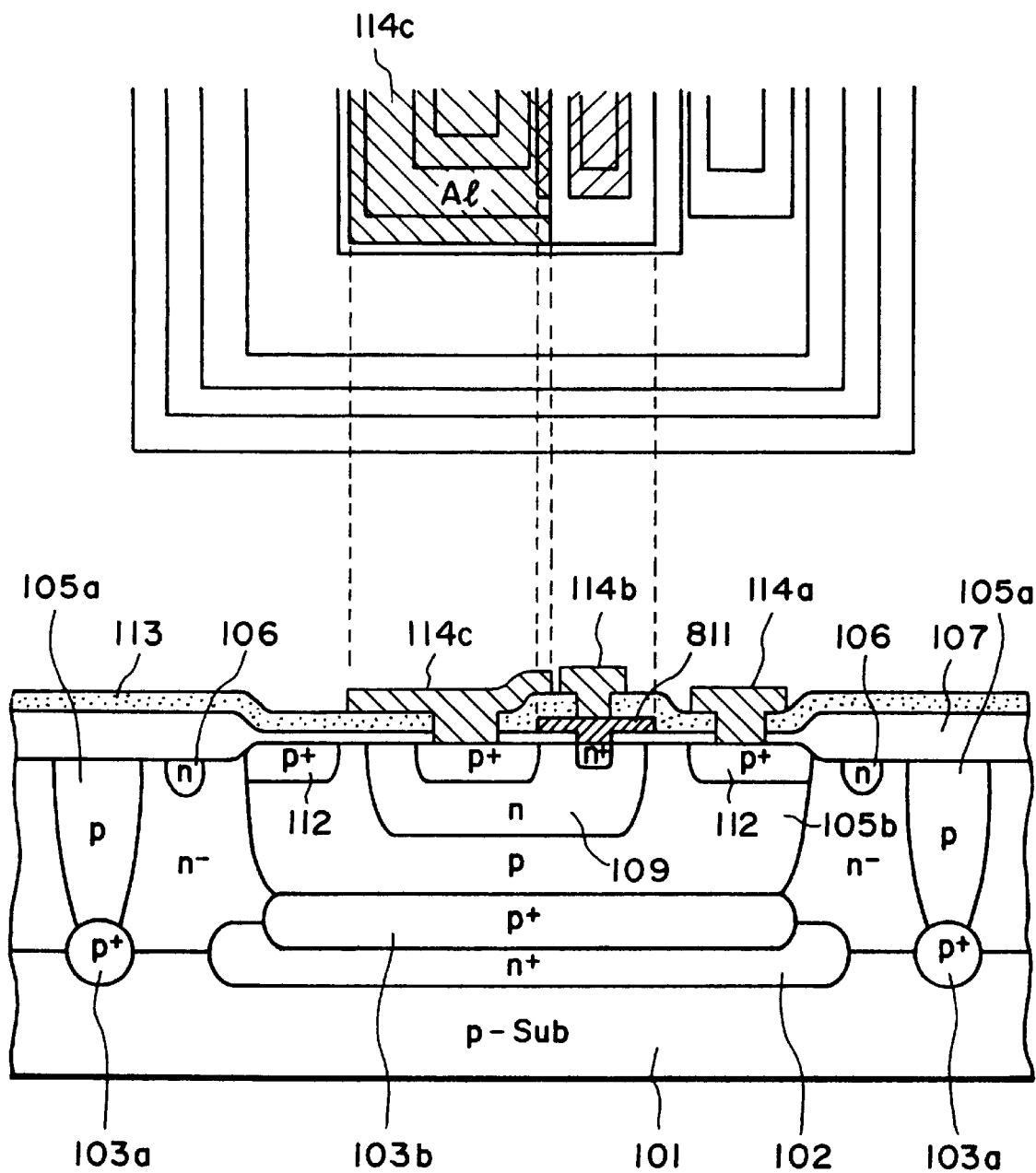

FIG. 8 shows the construction of a vertical pnp bipolar transistor produced in a still further embodiment. In this embodiment, in the production of the transistor, a field plate was provided on the surface of an n-type base region 109 in such a manner that that part of the base surface in the periphery of the emitter would be covered with both polysilicon 811 to be used as a part of the base electrode and a part of the metal, such as aluminum, used in the emitter electrode. Except for the above provision, the production process employed in this embodiment was the same as that in the first embodiment.

With the vertical pnp bipolar transistor according to this embodiment, it is possible to fix the surface potential of the n-type base region, and to restrain the withstand voltage between the collector and the emitter from being deteriorated.

As has been described above, when the base electrode of a vertical pnp bipolar transistor is formed by a DOPOS method, it is possible to reduce the cell size of the vertical pnp bipolar transistor to a value smaller than the corresponding value of a conventional device having a base electrode formed by an ion implantation method, and hence, to reduce the size of the IC chip.

Further, according to the present invention, when either the DOPOS of the base electrode or an ion-implanted layer is provided as a guard ring, it is possible to prevent the withstand voltage between the collector and the emitter from being deteriorated. A field plate method employing the metal, such as aluminum, on the base surface layer or polysilicon of the base electrode, also makes it possible to restrain the withstand voltage between the collector and the emitter from being deteriorated. These features are very effective in order to improve the reliability of the IC.

What is claimed is:

1. A semiconductor device comprising a vertical pnp bipolar transistor, comprising a collector region of p-type semiconductor, a base region of an n-type semiconductor and an emitter region of p-type semiconductor and a metal electrode connected to said base region;
   wherein said metal electrode is provided on said base region through a polysilicon doped with an impurity, said polysilicon being provided to form a first part of said base region having an impurity concentration higher than that in at least a second part of said base region, and said polysilicon is arranged to extend over the second part of said base region sandwiching a first insulating layer corresponding to said base region therebetween;
   wherein a metal used in said metal electrode is arranged to extend over said polysilicon sandwiching a second insulating layer provided on said first insulating layer therebetween; and
   wherein a metal used in an emitter electrode is arranged to extend over said emitter region and said base region in a periphery of said emitter region sandwiching said first and said second insulating layers therebetween.

2. A semiconductor device according to claim 1, wherein said polysilicon is provided surrounding said emitter region.

3. A semiconductor device according to claim 1, wherein said first part of said base region having a higher impurity concentration than said second part of said base region is an n$^+$ region adjacent to said polysilicon.

4. A semiconductor device according to claim 1, wherein said polysilicon is provided on a region substantially surrounding said emitter region through said first insulating layer corresponding to said base region.

5. A semiconductor device comprising a vertical pnp bipolar transistor, comprising a collector region of p-type semiconductor, a base region of an n-type semiconductor and an emitter region of P-type semiconductor and a metal electrode connected to said base region;
   wherein said metal electrode is provided on said base region through a polysilicon doped with an impurity, said polysilicon being provided to form a first part of said base region having an impurity concentration higher than that in at least a second part of said base region, and said polysilicon is arranged to extend over the second part of said base region sandwiching a first insulating layer corresponding to said base region therebetween;
   wherein a metal used in said metal electrode is arranged to extend over said polysilicon sandwiching a second insulating layer provided on said first insulating layer therebetween;
   wherein a metal used in an emitter electrode is arranged to extend over said emitter region and said base region in a periphery of said emitter region sandwiching said first and said second insulating layers therebetween; and
   wherein at least a part of said metal used in said emitter electrode overlaps with said polysilicon sandwiching said second insulating layer therebetween.

6. A semiconductor device according to claim 1 wherein said n-type semiconductor region of high impurity concentration substantially surrounds said emitter region.

7. A semiconductor device comprising:

a vertical bipolar transistor comprising a collector region, a base region and an emitter region, wherein said base region has a higher impurity concentration region and a lower impurity concentration region, a first insulating layer is provided on said base region, said first insulating layer has an opening over said higher impurity concentration region, said higher impurity concentration region is connected to a polycrystalline material including an impurity of the same conductivity type as said higher impurity concentration region through the opening, said polycrystalline material extends over said first insulating layer thereby covering the lower impurity concentration region of the base region;

a metal electrode electrically connected to said polycrystalline material, and having a section extending on said polycrystalline material sandwiching a second insulating layer provided on said first insulating layer therebetween;

an emitter electrode electrically connected to said emitter region; and a collector electrode electrically connected to said collector region.

8. A device according to claim 7, wherein said polycrystalline material is arranged to substantially surround said emitter region through said first insulating layer corresponding to said base region.

9. A device according to claim 7, wherein said polycrystalline material covers an entire area of said base region.

10. A device according to claim 7, wherein said metal electrode is arranged along said polycrystalline material.

* * * * *